United States Patent
Farahani et al.

(10) Patent No.: US 9,648,780 B2
(45) Date of Patent: May 9, 2017

(54) MANUFACTURING FIXTURES FOR SMALL FORM FACTOR DESKTOP COMPUTER

(71) Applicant: Apple Inc., Cupertino, CA (US)

(72) Inventors: Houtan R. Farahani, San Ramon, CA (US); Joseph B. Moak, San Jose, CA (US); Matthew D. Rohrbach, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 648 days.

(21) Appl. No.: 14/017,193

(22) Filed: Sep. 3, 2013

(65) Prior Publication Data

US 2014/0000427 A1   Jan. 2, 2014

Related U.S. Application Data

(63) Continuation of application No. 12/894,054, filed on Sep. 29, 2010, now abandoned.

(Continued)

(51) Int. Cl.
  *B23C 5/08* (2006.01)
  *H05K 7/20* (2006.01)
  (Continued)

(52) U.S. Cl.
  CPC ........... *H05K 7/20336* (2013.01); *B23C 3/30* (2013.01); *B23C 5/08* (2013.01); *B26D 3/14* (2013.01); *G06F 1/16* (2013.01); *G06F 1/181* (2013.01); *G06F 1/182* (2013.01); *G06F 1/185* (2013.01); *G06F 1/187* (2013.01); *G06F 1/20* (2013.01); *G06F 1/203* (2013.01); *H05K 13/00* (2013.01);
  (Continued)

(58) Field of Classification Search
  CPC .... B23C 3/28; B23C 3/30; B23C 5/08; B23C 2220/36
  See application file for complete search history.

(56) References Cited

U.S. PATENT DOCUMENTS 1,241,176 A * 9/1917 Watts ........................ E21B 7/00
                                                     408/229
2,354,639 A * 7/1944 Seymour ............. E04F 13/0803
                                                     144/136.1

(Continued)

FOREIGN PATENT DOCUMENTS

| JP | 03019715 A * 1/1991 |
| JP | 2008260108 A * 10/2008 |
| WO | WO2010050971 5/2010 |

OTHER PUBLICATIONS

LPC-39F Fanless Mini PC with Removable Hard Drive and Compact Flash, http://www.stealth.com/littlepc_395_fanless.htm, Nov. 2009, 3 pages.

*Primary Examiner* — Daniel Howell
(74) *Attorney, Agent, or Firm* — Downey Brand LLP

(57) ABSTRACT

One automated process for evenly applying a thin layer within a device housing includes applying a vacuum hold from a curved surface applicator to the thin layer, pressing the thin layer against the device housing with the applicator, wherein said pressing includes applying pressure from the center of the applicator first and then radially expanding said pressure, and pressing the cylindrical outer housing against an outer region of the thin layer to effect a hard pressed application at the outer surface thereof.

15 Claims, 12 Drawing Sheets

Related U.S. Application Data

(60) Provisional application No. 61/355,138, filed on Jun. 15, 2010, provisional application No. 61/355,144, filed on Jun. 16, 2010, provisional application No. 61/355,145, filed on Jun. 16, 2010, provisional application No. 61/355,150, filed on Jun. 16, 2010.

(51) Int. Cl.
 *B23C 3/30* (2006.01)
 *G06F 1/18* (2006.01)
 *G06F 1/20* (2006.01)
 *G06F 1/16* (2006.01)
 *H05K 13/00* (2006.01)
 *B26D 3/14* (2006.01)

(52) U.S. Cl.
 CPC ..... *B23C 2220/36* (2013.01); *Y10T 29/49002* (2015.01); *Y10T 29/49117* (2015.01); *Y10T 29/49169* (2015.01); *Y10T 29/49826* (2015.01); *Y10T 83/04* (2015.04); *Y10T 83/869* (2015.04); *Y10T 83/9391* (2015.04)

(56) References Cited

U.S. PATENT DOCUMENTS

| | | | |
|---|---|---|---|
| 2,418,960 A * | 4/1947 | Todd | F16B 23/0015 407/56 |
| 2,431,294 A * | 11/1947 | Dulmage | B23C 7/00 241/279 |
| 3,568,284 A * | 3/1971 | Lunen et al. | B23C 5/207 407/113 |
| 4,982,303 A | 1/1991 | Krenz | |
| 5,546,654 A | 8/1996 | Wojnarowski et al. | |
| 5,669,744 A * | 9/1997 | Hines | B23C 5/10 144/136.95 |
| 5,820,236 A | 10/1998 | Aoki | |
| 6,172,870 B1 | 1/2001 | Novotny | |
| 6,238,181 B1 | 5/2001 | Chen | |
| 6,378,586 B1 | 4/2002 | Lafond | |
| 6,423,928 B1 | 7/2002 | Piwczyk | |
| 6,459,576 B1 | 10/2002 | Bhatia et al. | |
| 6,556,529 B1 | 4/2003 | Onishi et al. | |
| 6,568,442 B1 * | 5/2003 | Meugniot | B23C 5/1054 144/134.1 |
| 6,574,115 B2 | 6/2003 | Asano et al. | |
| 6,639,796 B2 | 10/2003 | Cannon | |
| 6,918,174 B2 | 7/2005 | Kim et al. | |
| 6,919,532 B2 | 7/2005 | Swenson et al. | |
| 6,985,355 B2 | 1/2006 | Allirot | |
| 7,054,165 B2 | 5/2006 | Yi-Lung | |
| 7,073,412 B1 * | 7/2006 | Arnold | B23C 3/30 81/60 |
| 7,104,817 B2 | 9/2006 | Shiue et al. | |
| 7,114,245 B2 | 10/2006 | Ogimoto | |
| 7,182,118 B2 | 2/2007 | Cheung et al. | |
| 7,262,735 B2 | 8/2007 | Noe | |
| 7,355,845 B2 | 4/2008 | Kim et al. | |
| 7,455,915 B2 | 11/2008 | Johnson | |
| 7,457,111 B2 | 11/2008 | Merz et al. | |
| 7,532,470 B2 | 5/2009 | Ariga | |
| 7,539,009 B2 | 5/2009 | Hata et al. | |
| 7,643,284 B2 | 1/2010 | Nakamura | |
| 7,649,736 B2 | 1/2010 | Hongo | |
| 7,719,831 B2 | 5/2010 | Fujiwara | |
| 7,724,532 B2 | 5/2010 | Zadesky et al. | |
| 7,894,184 B2 | 2/2011 | Huang et al. | |
| 7,959,382 B2 * | 6/2011 | Volokh | B23C 5/10 407/53 |
| 7,995,343 B2 | 8/2011 | Suzuki et al. | |
| 8,072,754 B2 | 12/2011 | Zhang et al. | |
| 2004/0174676 A1 | 9/2004 | Shi-Tsung | |
| 2004/0246677 A1 | 12/2004 | Chen | |
| 2004/0252455 A1 | 12/2004 | Yi-Lung | |
| 2005/0259389 A1 | 11/2005 | Lin | |
| 2007/0131338 A1 | 6/2007 | Lisec | |
| 2007/0177294 A1 | 8/2007 | Adachi | |
| 2007/0211422 A1 | 9/2007 | Liu et al. | |
| 2008/0094795 A1 | 4/2008 | Neal et al. | |
| 2010/0008040 A1 | 1/2010 | Weber et al. | |
| 2010/0044855 A1 | 2/2010 | Eichelberger et al. | |
| 2010/0091442 A1 | 4/2010 | Theobald et al. | |
| 2010/0146766 A1 | 6/2010 | Dabov et al. | |
| 2010/0238619 A1 | 9/2010 | Shirasaka | |
| 2011/0063794 A1 | 3/2011 | Wu | |

* cited by examiner

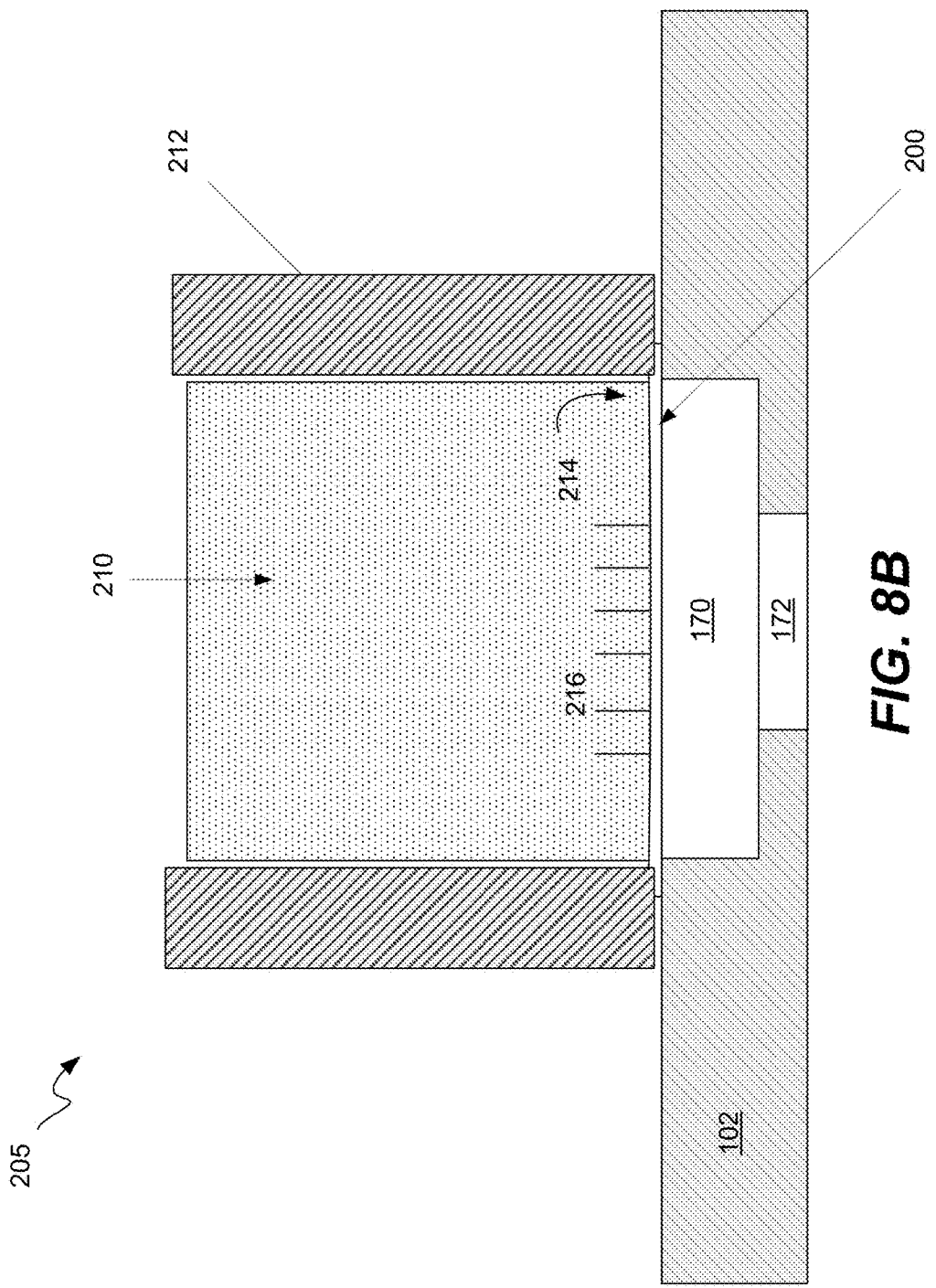

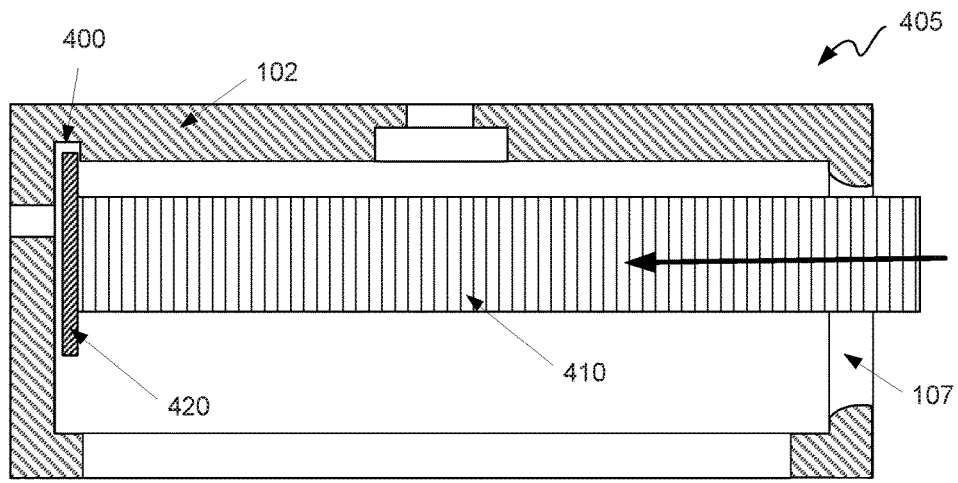
*FIG. 10A*
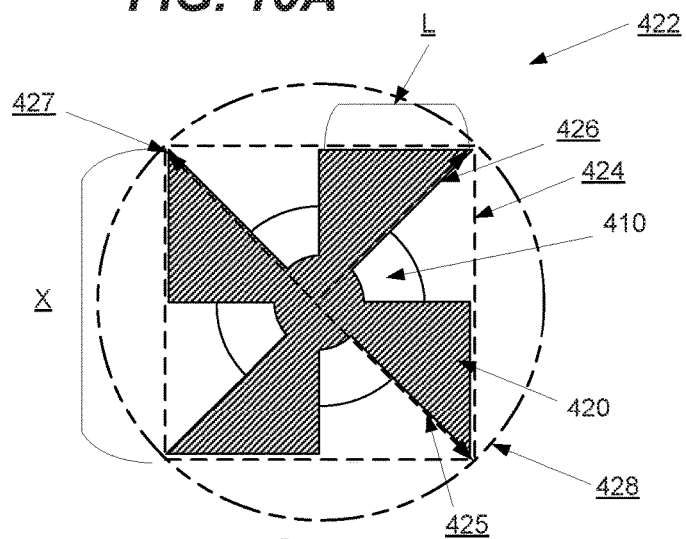
*FIG. 10B*
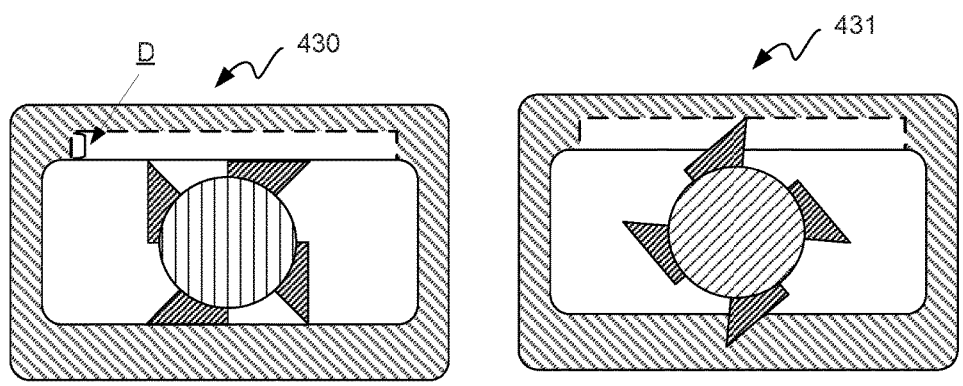
*FIG. 10C*  *FIG. 10D*

MANUFACTURING FIXTURES FOR SMALL FORM FACTOR DESKTOP COMPUTER

CROSS-REFERENCE TO RELATED APPLICATIONS

This application is a continuation of U.S. application Ser. No. 12/894,054, filed Sep. 29, 2010, entitled "Manufacturing Fixtures For Small Form Factor Desktop Computer", which claims the benefit of each of U.S. Provisional Patent Application No. 61/355,138, filed Jun. 15, 2010, entitled "Small Form Factor Desktop Computer;" U.S. Provisional Patent Application No. 61/355,144, filed Jun. 16, 2010, entitled "Electronic Components In A Small Form Factor Desktop Computer;" U.S. Provisional Patent Application No. 61/355,145, filed Jun. 16, 2010, entitled "Cooling Arrangement For Small Form Factor Desktop Computer;" and U.S. Provisional Patent Application No. 61/355,150, filed Jun. 16, 2010, entitled "Manufacturing Fixtures For Small Form Factor Desktop Computer," each of which is incorporated by reference herein in its entirety and for all purposes.

TECHNICAL FIELD

The present invention relates generally to small form factor desktop computing devices, and more particularly to dust guard arrangements for such small form factor desktop computing devices.

BACKGROUND

In recent years, small form factor desktop computers such as the Mac Mini™ manufactured by Apple Inc. of Cupertino Calif. have been developed. These small form factor desktop computers provide basic computing services such as those provided by a central processing unit, or CPU, without the traditional I/O devices such as a keyboard and monitor usually associated with a standard desktop computer. By providing basic computer services, the small form factor desktop computer is affordable and can be easily customized for applications that would be unsuitable or at best difficult for the standard desktop computer. For example, the small form factor desktop computer can be easily placed on a shelf or in a cabinet and configured to operate as a media control center. In contrast to the small form factor desktop computer, in order to use the standard desktop computer as the media control center, a sturdy shelf or large cabinet must be used. Moreover, most people would not appreciate a standard desktop computer in plain view and would most likely opt to hide the unit. In this way, the small form factor desktop computer lends itself to applications that would otherwise be unsuitable for a standard desktop computer.

The reduction in size compared to standard desktop computers and the ease of use provide two reasons for the growing popularity of small form factor desktop computers. Factors that contribute to the reduction in size and ease of use can be attributed to the manufacturer's ability to fabricate various operational components in smaller and smaller sizes while increasing their power and/or operating speed. However, this trend of smaller, lighter and more powerful computers presents a continuing design challenge. One design challenge associated with the small form factor desktop computer is the design of the enclosure used to house the various internal components. This design challenge arises from a number conflicting design goals that includes the desirability of making the enclosure lighter and yet rugged and strong in addition to being aesthetically pleasing. Conventional approaches to making computer enclosures lighter rely upon the extensive use of plastic. Although the conventional plastic design is generally lighter, enclosures formed entirely of plastic tend to be more flexible and therefore less rugged. Therefore, in order to strengthen the housing and form a more rigid and rugged structure, thicker plastics are generally used. However, even though the increase in thickness is consistent with a stronger and more rugged enclosure, the thicker plastic adds weight and bulkiness that can lead to user dissatisfaction.

Computer enclosures are generally mechanical assemblies having multiple parts that are screwed, bolted, riveted, or otherwise fastened together at discrete points that can result in cracks, seams, gaps or breaks at the mating surfaces and fasteners located along the surfaces of the housing. For example, a mating line surrounding the entire enclosure is produced when using an upper and lower casing. Moreover, the various components and complicated processes used to manufacture the computer can make assembly a time consuming and cumbersome process requiring, for example, a highly trained assembly operator working with special tools.

In view of the foregoing, there is a need for improved component density and associated assembly techniques that reduce cost and improve outgoing quality. In addition, there is a need for improvements in the manner in which small form factor desktop computers are assembled such as improvements that enable various structures and items to be quickly and easily installed within the enclosure. In particular, where fewer components are used to complete the housing and structure of a limited size computing device, traditional techniques and manufacturing fixtures that are used for assembling and applying tapes, films, dust guards and other internal device components may not be ideal.

While many designs and techniques used to provide manufacturing fixtures for small form factor desktop computing devices have generally worked well in the past, there is always a desire to provide further manufacturing fixtures and techniques for applying dust guards in a compact device.

SUMMARY

A small form factor desktop computer is disclosed. The small form factor desktop computer is formed of at least a single piece (uni-body) housing. The single piece housing includes a bottom opening arranged to provide access to internal operational components, a front opening arranged to accommodate a plurality of I/O interfaces, and a slot opening suitable for receiving an optical disk such as a DVD. The single piece housing can, in turn, include an integral top portion, side walls and a bottom portion that cooperate to form a cavity in cooperation with the front opening, the bottom opening, and slot opening. The integral top portion has a substantially flat surface and curved edges to meet the side walls having rectilinear edges arranged such that they form a flat side surface. An interior surface of the top portion includes a plurality of etched ground points suitable for connecting electrical components to a chassis ground. The small form factor desktop computer also includes a foot disposed within the bottom opening that can be removed by a user to provide access to at least some operational components enclosed within the single piece housing.

A method is carried out by receiving a uni-body housing, the uni-body housing formed of metal to provide a chassis ground, inserting a first operational component into an opening in the uni-body housing, attaching the first component directly to an interior surface of the housing an attachment feature directly formed in the housing, wherein the attaching also provides an electrically conductive path to the chassis ground, inserting a second component into the housing through the opening, attaching the second component to an attachment fixture coupled to the housing, wherein the second component is not directly attached to the first component, inserting a third component into the opening, attaching the third component to the attachment feature, and securing the third component to the housing by way of the attachment feature by way of the first component, wherein the first, second, and third components are sized and shaped to form a compact integrated component assembly within the housing.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatus and method for providing effective manufacturing fixtures in the making of small form factor desktop computing devices. These drawings in no way limit any changes in form and detail that may be made to the invention by one skilled in the art without departing from the spirit and scope of the invention.

FIG. 8B illustrates in side cross-section view the tape fixture assembly of FIG. 8B having applied the thin layer tape to the housing according to one embodiment of the present invention.

FIG. 10A illustrates in side cross-section view the formation of an internal elongated notch in a housing and an exemplary cutter therefor according to one embodiment of the present invention.

FIG. 10B illustrates in front elevation view an exemplary pinwheel cutting blade according to one embodiment of the present invention.

FIG. 10C illustrates in front elevation view the exemplary cutting blade of FIG. 10A being inserted into the internal cavity of the housing according to one embodiment of the present invention.

FIG. 10D illustrates in front elevation view the exemplary cutting blade of FIG. 10A as inserted into the internal cavity of the housing and cutting the internal elongated notch according to one embodiment of the present invention.

DETAILED DESCRIPTION

Figure 1:
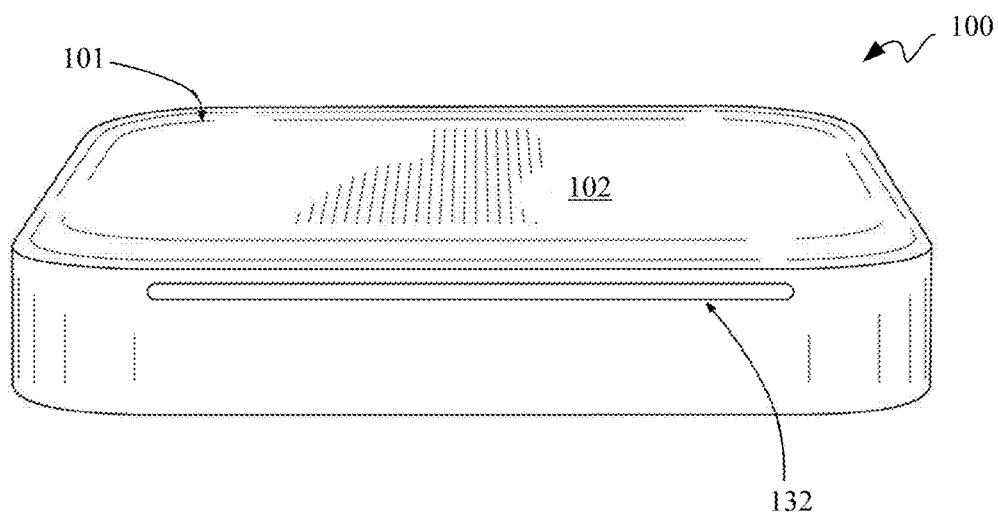
FIG. 1 illustrates in front facing perspective view an exemplary small form factor desktop computing device in an open state according to one embodiment of the present invention.

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to a small form factor desktop computing device, such as the Mac Mini™ manufactured by Apple Inc. of Cupertino, Calif. The small form factor desktop computing device can have an outer housing formed from a single piece of material, such as an aluminum housing formed from a single billet of aluminum, such that it comprises a uni-body housing. In addition, suitable manufacturing fixtures can allow for a readily automated installation or application of various internal components, such as tapes, films and felt guards, without significantly sacrificing the overall aesthetic appearance of the device. These general subjects are set forth in greater detail below.

Outer Housing

The single piece seamless housing includes an aesthetically pleasing foot support having at least a portion formed of RF transparent material that provides easy user access to selected internal components as well as offers electromagnetic (EM) shielding. This simplicity of design can accrue many advantages to the small form factor desktop computer besides those related to aesthetic look and feel. For example, fewer components and less time and effort can be required for assembly of the small form factor desktop computer and the absence of seams in the single piece housing can provide good protection against environmental contamination of internal components as well as EM shielding.

In the described embodiments, the single piece seamless housing can be formed from metal. In the case where the single piece seamless housing is formed of metal, the metal can take the form of a single billet of aluminum. The single billet of metal can be formed into a shape appropriate for housing various internal components as well as providing various openings into which switches, connectors and so on can be accommodated. The single piece seamless housing can be machined into a desired shape. The shape of the housing can have spline contours in that an upper portion of the housing can have a spline contour. One of the advantages to using metal for the housing is ability of metal to provide good electrical grounding for any internal components requiring a good ground plane. For example, performance of a built in RF antenna can be substantially improved when a good ground plane is provided. Moreover, a good ground plane can be used to help mitigate the deleterious effects caused by, for example, of electromagnetic interference (EMI) and/or electrostatic discharge (ESD).

Turning first to FIG. 1, an exemplary small form factor desktop computing device in an open state is shown in front facing perspective view. Small form factor desktop computer 100 can process data and more particularly media data such as audio, video, images, etc. By way of example, small form factor desktop computer 100 can generally correspond to a device that can perform as a music player, game player, video player, media center and/or the like. Small form factor desktop computer 100 can be easily placed in a convenient location such as a desktop, shelf or small cabinet due to both the small footprint and lightweight of small form factor desktop computer 100. Small form factor desktop computer 100 can include single piece seamless housing 102 formed of metal such as aluminum which can be processed into a desired shape. In those cases where small form factor desktop computer 100 has a metal housing and incorporates RF based functionality, it may be advantageous to provide at least a portion of housing 102 in the form of radio (or RF) transparent materials. The radio transparent material can include, for example, plastic, ceramic, and so on. The wireless communications can be based on many different wireless protocols including for example Bluetooth, RF, 802.11, FM, AM, and so on. Any number of antennas may be used, which can use a single window or multiple windows depending on the needs of the system. Portions of housing 102 can be removed by machining and replaced with radio-transparent materials.

Housing 102 can be configured to enclose any suitable number of internal components associated with the small form factor desktop computer 100. For example, housing 102 can enclose and support internally various structural and electrical components (including integrated circuit chips and other circuitry) to provide computing operations for small form factor desktop computer 100. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on. Housing 102 can include various openings some of which can be used to receive disk based media such as DVDs or CDs whereas other openings can be used during assembly for placing internal components. For example, as shown in FIG. 1, ODD slot opening 132 can be user to accept optical disk media such as DVDs and CDs, whereas Small form factor desktop computer 100 can include a mechanism for wireless communications, as either a transceiver type device or receiver only, such as a radio, small form factor desktop computer 100 can include an antenna that can be disposed internal to a radio transparent portion of housing 102.

Figure 2:
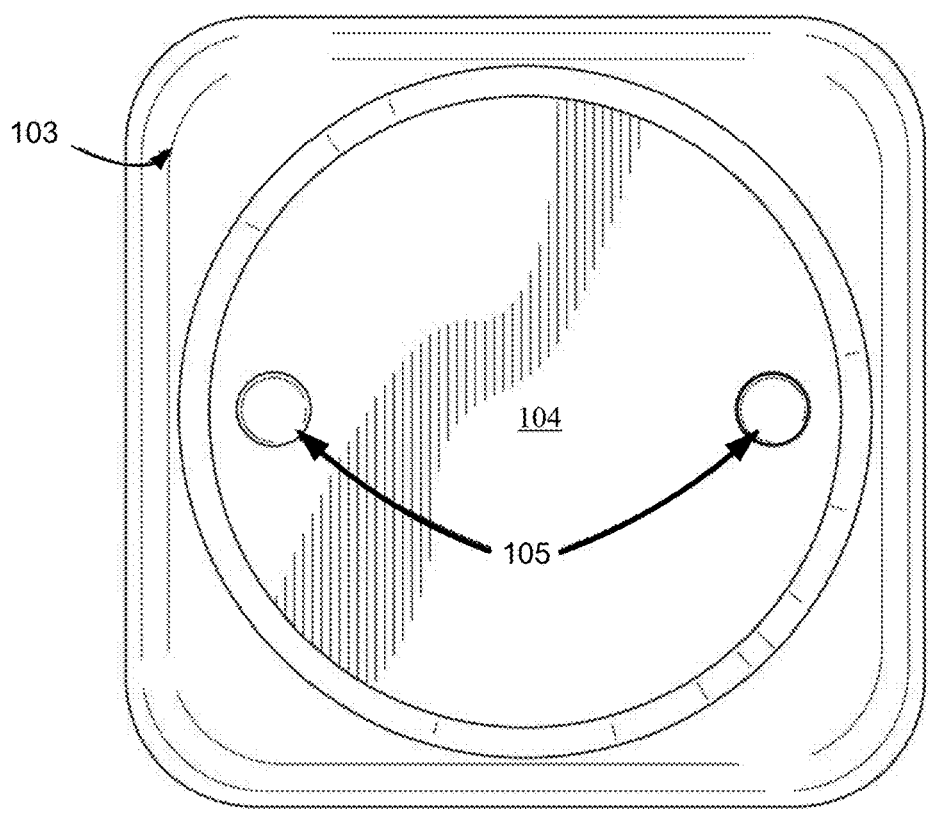
FIG. 2 illustrates in bottom plan view the exemplary small form factor desktop computing device of FIG. 1 with a removable foot installed therein according to one embodiment of the present invention.

FIG. 2 illustrates in bottom plan view the exemplary small form factor desktop computing device of FIG. 1 with a removable foot installed therein according to one embodiment of the present invention. As shown in FIGS. 1 and 2, small form factor desktop computer 100 generally includes a top side 101 and a bottom side 103, with a removable foot 104 being located on the bottom side. Foot 104 can be easily removed using finger recesses 105 to press and rotate foot 104 without the need for a tool to reveal a bottom opening and various internal components.

Figure 3:
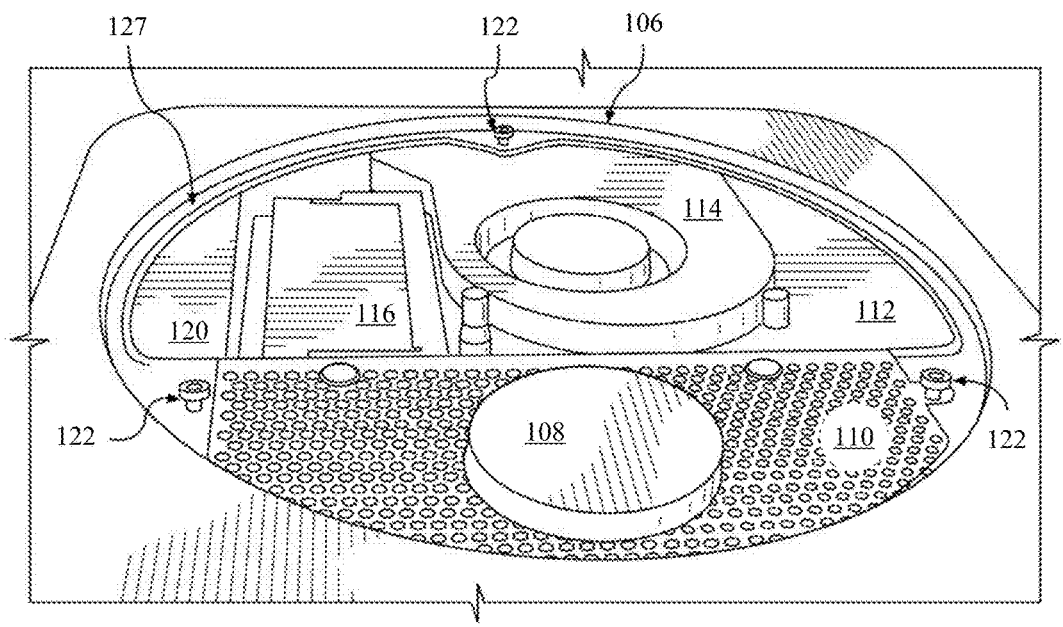
FIG. 3 illustrates in bottom perspective view the exemplary small form factor desktop computing device of FIG. 1 with its removable foot removed therefrom according to one embodiment of the present invention.

Moving next to FIG. 3, the exemplary small form factor desktop computing device of FIG. 1 is illustrated in bottom perspective view with its removable foot removed therefrom. The foot has been removed to expose internal components such as RF antenna 108, antenna plate 110, cowling 112, fan assembly 114, interchangeable memory cards 116, and power supply 120, among other items. It should be noted that cowling 112 is preferably inserted after antenna plate and before fan assembly 114.

By way of removing foot 104, the user is granted easy access to those internal components such as memory cards 116 that the user may want to update. In the described embodiment, foot 104 can be secured to housing 102 and cover opening 106 by spring fasteners 122 that can be disengaged (and therefore release foot 104) by pressing foot 104 while concurrently applying a rotational force to foot 104 at finger recesses 105. In this way, the user can easily access various internal components without the need to use a special tool such as a putty knife, screw driver and so forth. Foot 104 can be formed of slip resistant material and can thus be used to provide slip free support for small form factor desk top computer 100.

Figure 4:
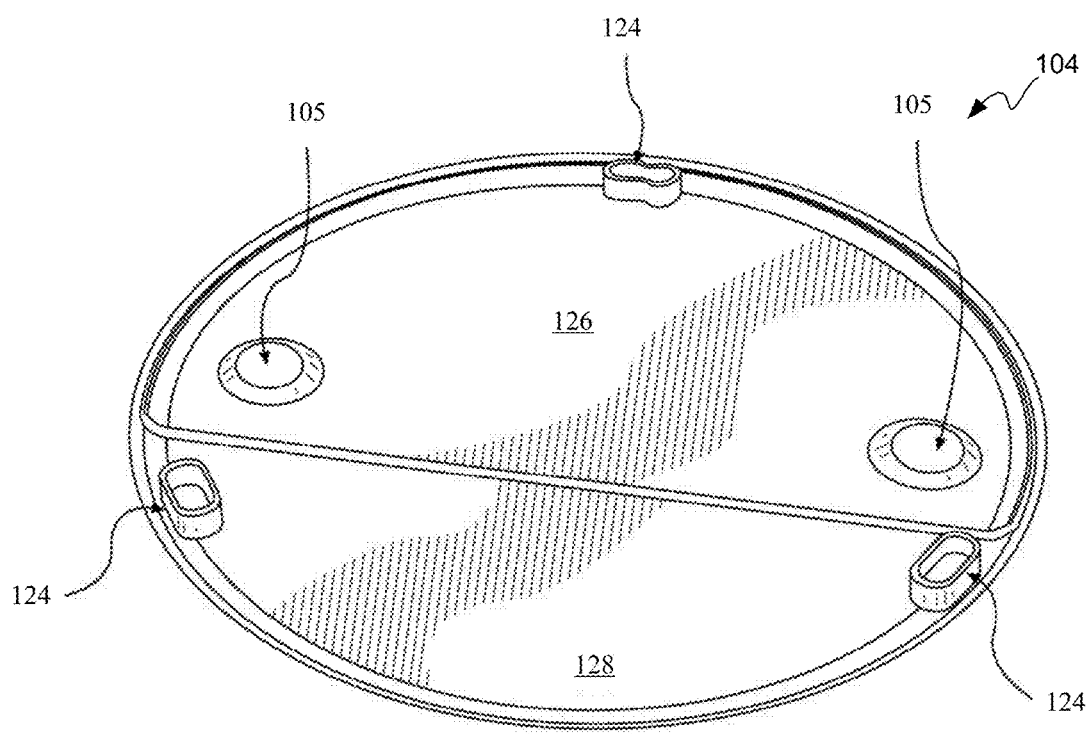
FIG. 4 illustrates in obverse perspective view a removable foot according to one embodiment of the present invention.

FIG. 4 illustrates in obverse perspective view a removable foot according to one embodiment of the present invention. Illustrated here are receptors 124 that are used with fasteners 122 to secure foot 104 to housing 102. As can be seen, receptors 124 are shaped to accommodate the shape of fasteners 122 in such a way that a slight pressing action and rotational movement is all that is required to disengage fasteners 122 and receptors 124. It should be noted that that portion of foot 104 that does not align with antenna plate 110 (which acts as both EM shield and support structure) includes EM shield 126. In this way, housing 102 being formed of metal along with EM shield 126 and antenna plate 110, RF sensitive circuits within small form factor desktop computer 100 or in close proximity to small form factor desktop computer 100 are well shielded from the effects of EMI. It should also be noted that that portion of foot 104 that is part of EM shield 126 is used as an air intake area for fan assembly 114.

It should also be noted that the outer edge of EM shield 126 can help to prevent or severely restrict air intake from ambient air outside the overall device where the EM shield coincides with the outer edge of the removable foot 104. As shown in FIG. 4, this can effectively result in an air intake region 128 at the area of the removable foot where the EM shield 126 is not present. The remaining region is then effectively a "no air intake" region. Where desired, this effect can be accentuated, such as by the use of a raised ridge 127 in the outer housing, as shown in FIG. 3. Such a raised ridge 127 can be integrally formed in outer housing 102 when the housing is originally formed and machined, for example. It will be readily appreciated that alternative shapes and formations of the housing, foot, EM shield and the interfaces between these items can result in different operating requirements, features and/or air intake region results. For example, various alternatives to these components can result in an air intake region that is around substantially the entire circumference of the foot. It is specifically contemplated that any and all such arrangements can be used in conjunction with the present invention.

Figure 5:
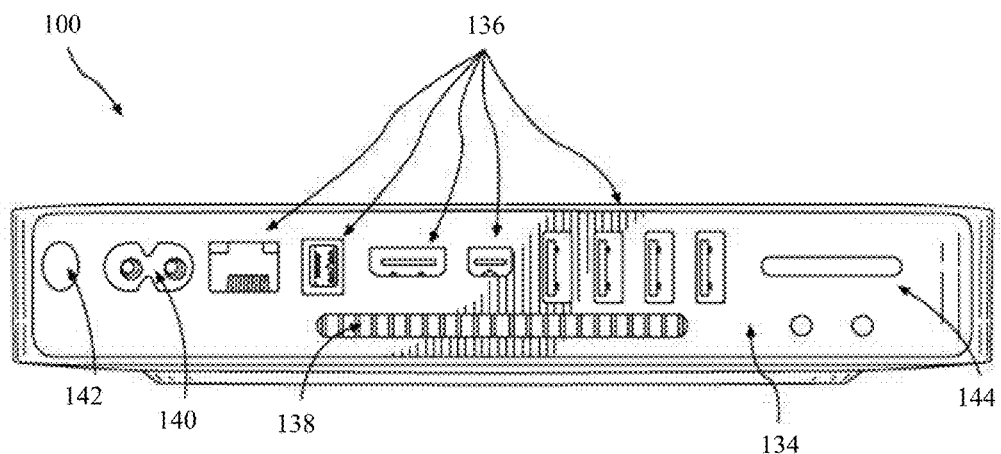
FIG. 5 illustrates in side elevation view an exemplary input and output (I/O) wall inserted into the rear sidewall of an exemplary small form factor desktop computing device according to one embodiment of the present invention.

FIG. 5 illustrates in side elevation view an exemplary input and output (I/O) wall inserted into the rear sidewall of an exemplary small form factor desktop computing device according to one embodiment of the present invention. As shown from the rear, small form factor desktop computer 100 can include an I/O wall insert 134 formed of plastic that includes a plurality of I/O ports 136 (HDMI, FireWire, Ethernet, and so on), an air exhaust vent portion of an air processing manifold 138, AC power receptacle 140, power button 142, and memory card slot 144, among other possible items. Based on this arrangement, it will be appreciated that a cooling airflow exiting the air exhaust vent portion of air processing manifold 138 will also simultaneously be exhausted from the overall computer 100.

Figure 6:
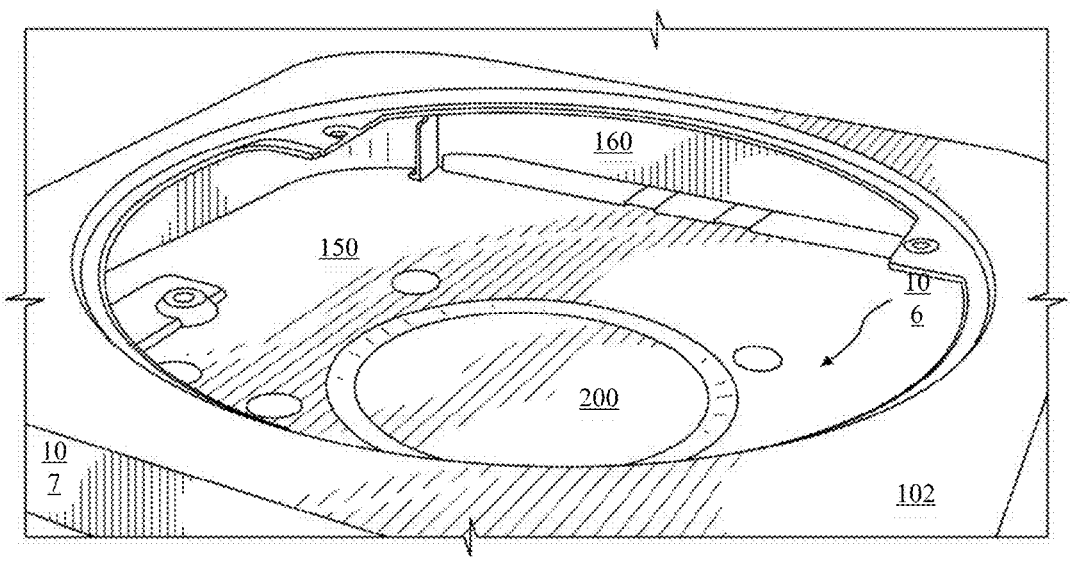
FIG. 6 illustrates in top perspective view the inner cavity of an exemplary single piece seamless housing used to enclose various internal components of a small form factor desktop computing device according to one embodiment of the present invention.

Moving next to FIG. 6, the inner cavity of an exemplary single piece seamless housing used to enclose various internal components of a small form factor desktop computing device is illustrated in top perspective view. FIG. 6 depicts a representative interior view of cavity (also referred to as lumen) 150 of single piece seamless housing 102 used to enclose various internal components of the small form factor desktop computer 100 described above. In the described embodiment, single piece seamless housing 102 can be formed from a single piece of metal (such as aluminum) and formed into an appropriate shape using, for example, using various ingenious machining techniques. Metal logo film or shield 200 can be used to provide EM shielding from an opening (not shown) in the housing 102 that is used to accommodate a logo on the upper surface of housing. Logo shield 200 can be glued or otherwise attached in an inside surface of the upper part of housing 102. Housing 102 can include a number of features used to facilitate the installation of internal components used in the assembly of small form factor desktop computer 100. For example, internal components can be inserted using either opening 106 or opening 107 sized to accommodate I/O wall 134.

A number of alignment and locking features machined into or attached to the structure of housing 102 can be used to align and fasten various internal components during assembly. For example, bezel 160 can be used to mount and align internal components such as a hard disk drive and/or optical disk drive as well as a power supply. The various internal components are formed in such a way to include various interlocking features that can be user to greatly simplify the assembly process, which can be analogized to assembling a ship in a bottle in that assembly is carried out by inserting each component in a particular order. Once inserted, the internal component is aligned with and at least partially secured by previously inserted components. For example, each internal component fits and aligns with other internal components. The interlocking features can also greatly reduce the number of fasteners that must be used to secure the internal components to housing 102. In addition, various alignment features machined into the structure of housing 102 can provide both alignment reference points. In this way, one component, such as the optical disk drive and power supply, can be aligned and mounted to housing 102 directly whereas other components such as main logic board and fan assembly can be aligned with attachment features associated with the optical disk drive. In this way, the various components are assembled in such as way as to reduce the overall tolerance stack. In this way small form factor desktop computer 100 can be fabricated using an assembly process can be carried out by inserting and aligning specific components in a particular order.

In order to discuss better various internal features and manufacturing fixtures for the creation and/or installation thereof, it can be useful to depict single piece seamless housing 102 from another point of view. Continuing on to FIG. 7, the single piece seamless housing of FIG. 6 and various internal features thereof are shown in side cross-sectional view. As depicted and noted above, housing 102 can include various openings therethrough, such as bottom opening 106 for a removable foot, a rear wall opening 107 for an I/O wall, and a front wall ODD slot opening 132. Various internal features can include a logo shield or tape 200, a dust guard 300 for the ODD slot opening, and an elongated trough or notch 400 in the housing proximate to the felt guard. The installation or formation of each of these features 200, 300, 400 can be relatively interesting in light of the nature of housing 102 being formed from a single seamless piece of material. Accordingly, the installation and formation of these particular features is set forth in greater detail below.

Tape Fixture Assembly

Logo film or shield 200 can generally be a thin layer metal tape or film that is used to provide a continuous EM shield across portions of the housing 102 that have openings or are otherwise discontinuous with respect to EMI. Such a tape application can involve the application of a thin aluminum foil or film having an adhesive on one side thereof, which can be placed over an inserted component 170/172. Such an inserted component can take the shape of a logo, for example, such that the logo is presented on an exterior surface of the device. One example of such a housing insert is the Apple logo. Such cosmetic inserts can present issues where the outer housing is being used in a functional manner, such as for an EM shield or grounding structure, for example. In such instances, the application of a conductive tape over an internal surface of the cosmetic insert can correct any hole in the EM shield, for example. Other purposes and applications of thin films within and about the overall device 100 are also possible, and it is specifically contemplated that the tape fixture assembly fixture provided below can also be used for the application of such alternative tapes and films.

One problem that can be encountered by the application of such a thin film by using an adhesive is that one or more air pockets or other imperfections can arise during the application process. Although avoidance of such imperfections can sometimes be avoided by way of a careful hand application, such efforts are costly and unreliable. Furthermore, manual application of tapes, thin films and other similar items can inherently result in discrepancies and differences from one application or device to another. Accordingly, a reliable automated process for applying a thin layer or film by way of adhesive in a restricted space without creating any air pockets or blemishes is desired.

Figure 7:
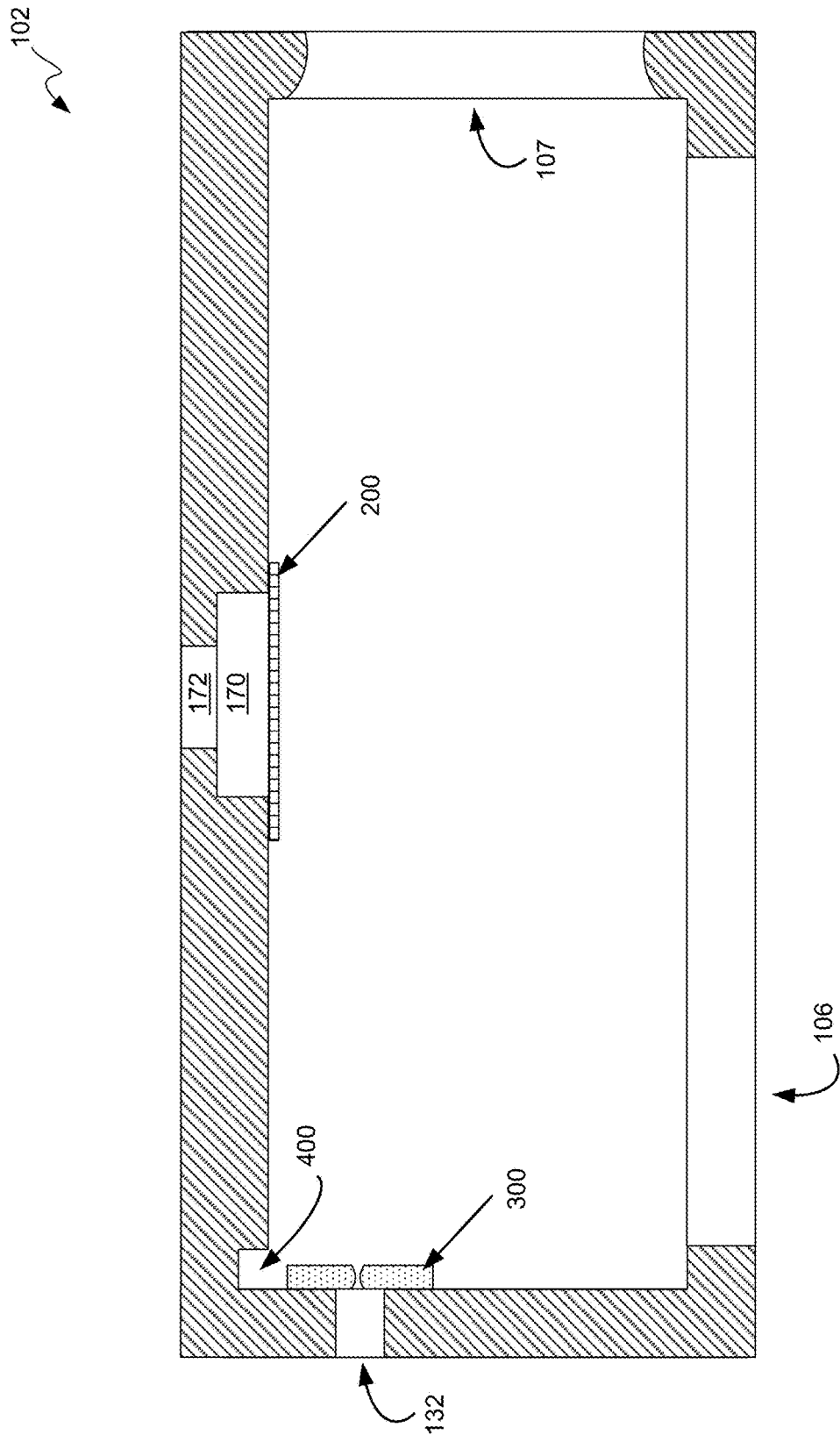
FIG. 7 illustrates in side cross-section view the single piece seamless housing of FIG. 6 with further components installed therein according to one embodiment of the present invention.
Figure 8A:
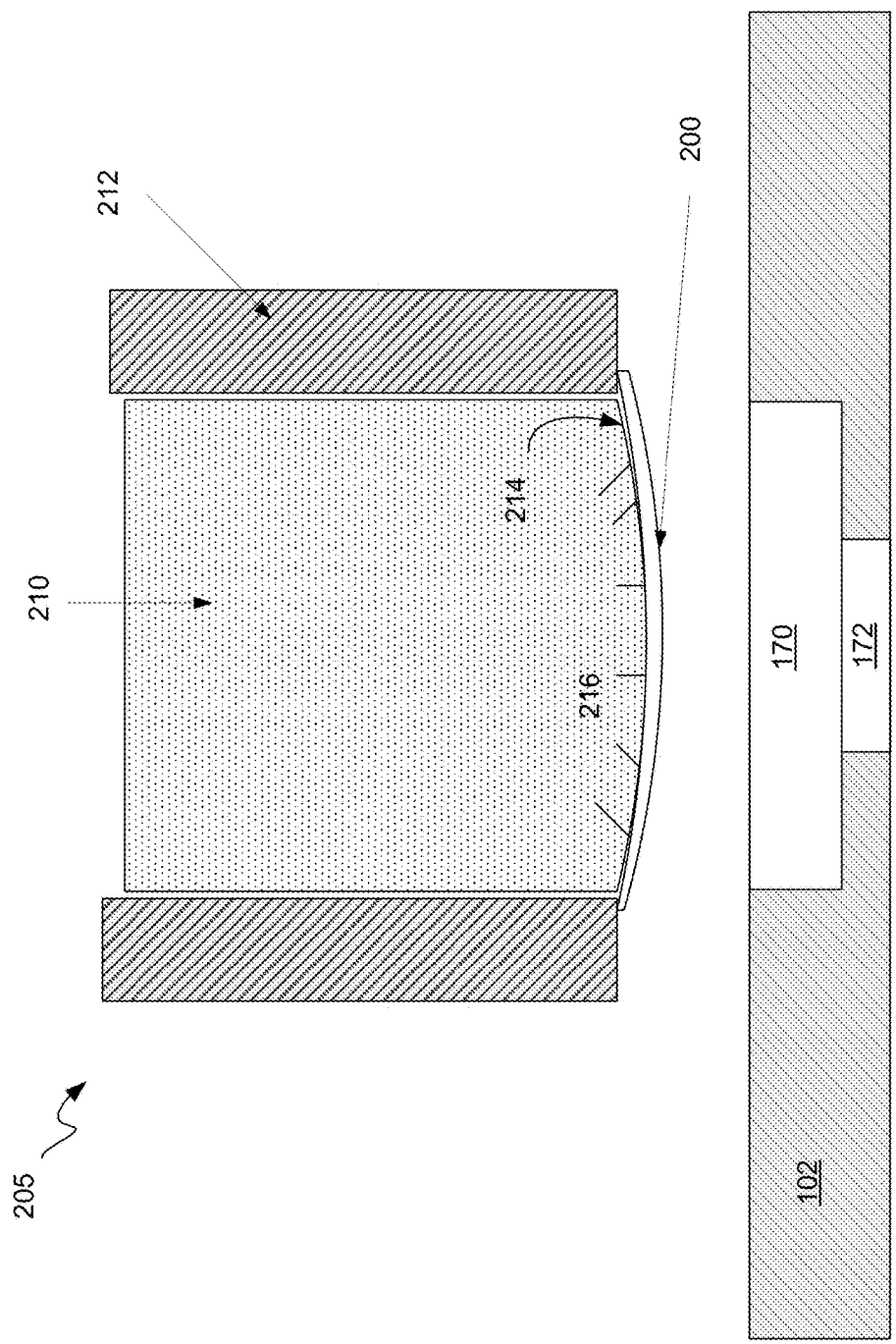
FIG. 8A illustrates in side cross-section view a tape fixture assembly preparing to apply a thin layer tape to an internal surface of the housing of FIG. 7 according to one embodiment of the present invention.

Turning next to FIGS. 8A and 8B, a tape fixture assembly adapted for the application of a thin layer tape to an internal surface of the housing of FIG. 7 is shown in side cross-sectional view. Tape fixture assembly 205 includes a center applicator 210 that can be made from low durometer rubber or another suitable compressible material. One or more side walls 212 can be comprised of a hard plastic or other suitably stiff material. In the event of a round or curved applicator, a single continuous curved sidewall or "sleeve body" 212 may be used. Applicator 210 can have a slightly three-dimensionally curved surface 214 at its application end, such that pressure is first applied only at the center of the applied thin film, with pressure then being gradually increased in a radial manner outward as the material of the applicator is compressed and more of the curved surface contacts and presses against the film. One or more vacuum holes 216 in applicator 210 can be used to hold the applicable thin film 200 being applied against the applicator just prior to application, although other suitable holding techniques can be used. At this point, any adhesive cover or shield (not shown) can be removed to expose the underlying adhesive for attachments to housing 102 and insert 170/172.

As will be readily appreciated, the cosmetic insert can have a smaller diameter portion 172 toward the outer surface of the device, with a larger diameter portion 170 that is covered by the conductive film 200. In addition, insert 170/172 can be partially recessed within the opening created for it in housing 102, such that there is a small offset or step (not shown) between portion 170 of the logo and the housing 102. Such an imperfect non-flush alignment between the surfaces of housing 102 and insert portion 170 can be due to different materials, part tolerances and/or other manufacturing considerations, as will be readily appreciated. Accordingly, it is preferable that the side wall(s) 212 on tape fixture assembly 205 contact the housing 102 and not the insert portion 170, while compressible center applicator 210 with its curved surface 214 contacts the insert portion 170 and not the housing 102. In this manner, side wall(s) 212 and center applicator 210 can readily apply a thin film 200 that spans across the insert 170 and housing 102 at different offsets and/or elevations.

FIG. 8B shows the thin film 200 after it has been applied by tape fixture assembly or system 205. The applicator 210 compresses at its curved surface 214 from the center outward during application and eventually becomes flattened thereby, such that any trapped air bubbles or pockets in film 200 are pushed to the outer edges of the film or guard 200 and escape at its edges. The lower distal edges of the harder one or more side walls 212 then firmly press against the outer edges at or near the circumference of the applied film 200 to effect a final press seal of the film against the outer housing 102. In various embodiments, pressure from the one or more side walls is not effected until there is at least some compression of the center applicator, particularly at the curved surface thereof.

Felt Guard Assembly

Figure 9A:
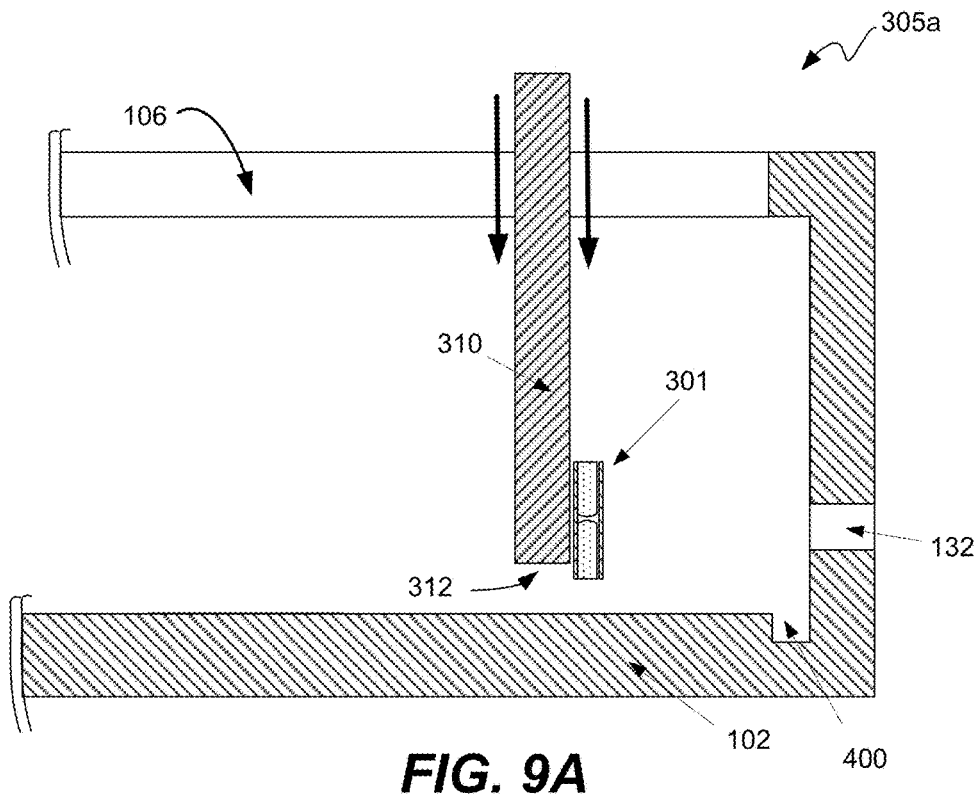
FIGS. 9A-9D illustrate in side cross-section view an installation of an ODD guard and an exemplary fixture therefor according to one embodiment of the present invention.
Figure 9B:
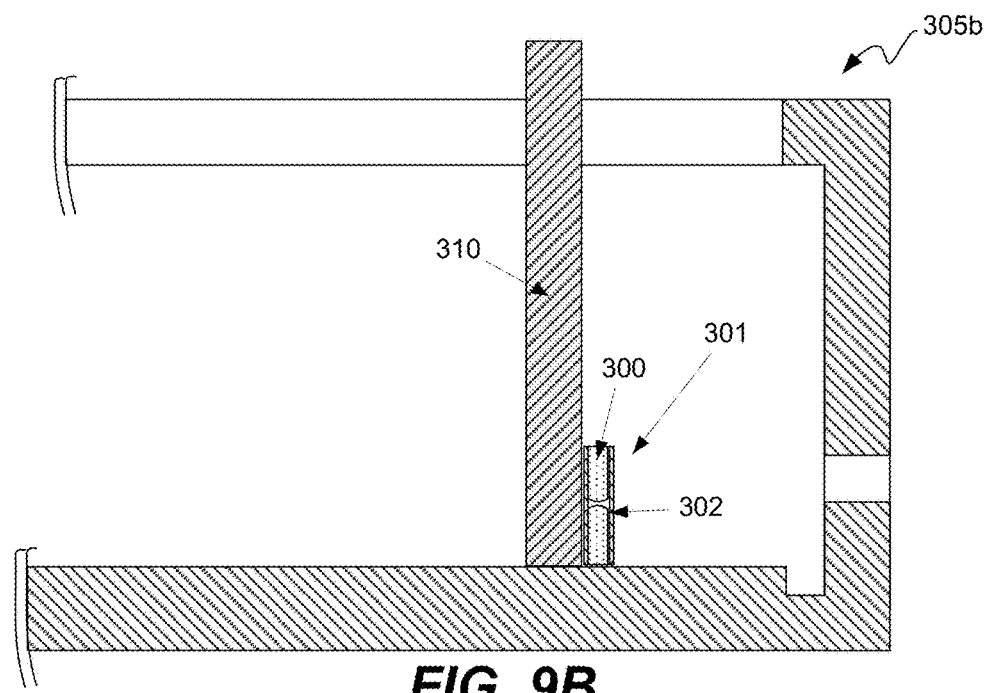

Moving next to FIGS. 9A-9D, an exemplary installation of an ODD dust guard within the housing is illustrated in side cross-section view. Such an ODD dust guard can be, for example, a felt ODD guard having an elongated slit or opening therethrough, as will be readily understood by those skilled in the art. FIG. 9A shows a dust guard assembly 305a adapted for the application of a felt dust guard or inhibitor 300 to an ODD slot. Although discussed in terms of a felt dust guard, it will be readily appreciated that a dust guard or inhibitor formed from any suitable material can be used in conjunction with the installation procedure disclosed herein.

System or assembly 305a includes a felt guard application fixture 310 having a bottom surface 312 that is adapted to contact flush the upper surface of housing 102 within the cavity of the housing. Fixture 310 can be adapted to control a felt guard application unit or combo 301, and can be inserted into the cavity of the housing through opening 106, for example. As noted above, it may be desirable to install the ODD dust guard at or about ODD slot or opening 132, and preferably on the inside of the overall device 100 for aesthetic purposes. ODD slot or opening 132 can be proximate to elongated notch or trough 400, such that a bezel (not shown here) can be readily installed along the front wall having the slot 132, as noted above. The felt dust guard can be installed onto the internal housing wall directly, or onto the surface of the bezel, as may be desired.

As shown in FIG. 9A, the felt guard application fixture 310 can be inserted downward from opening 106 into the housing. Continuing with FIG. 9B, it can be seen that fixture 310 is inserted until its surface 312 is flush against the housing 102. Felt guard application unit 301 includes one or more internal felt portions 300 and front and back linings 302 that are adapted to be removed during installation. Felt application unit 301 is held against a front surface of felt application fixture 310 during the application process, such as by a vacuum hold. One feature of the applied vacuum hold is that the felt application unit 301 is adapted to slide against its holding surface on the application fixture 310. This hold feature allows the bottom surface of the felt application unit 301 to become flush against the top surface of housing 102 at the same time that the bottom surface 312 of the application fixture 310 contacts the housing surface. The result is higher certainty in the alignment of the felt application unit 301 for the subsequent application process against the inside of the front face of the device or the bezel installed thereto.

Figure 9C:
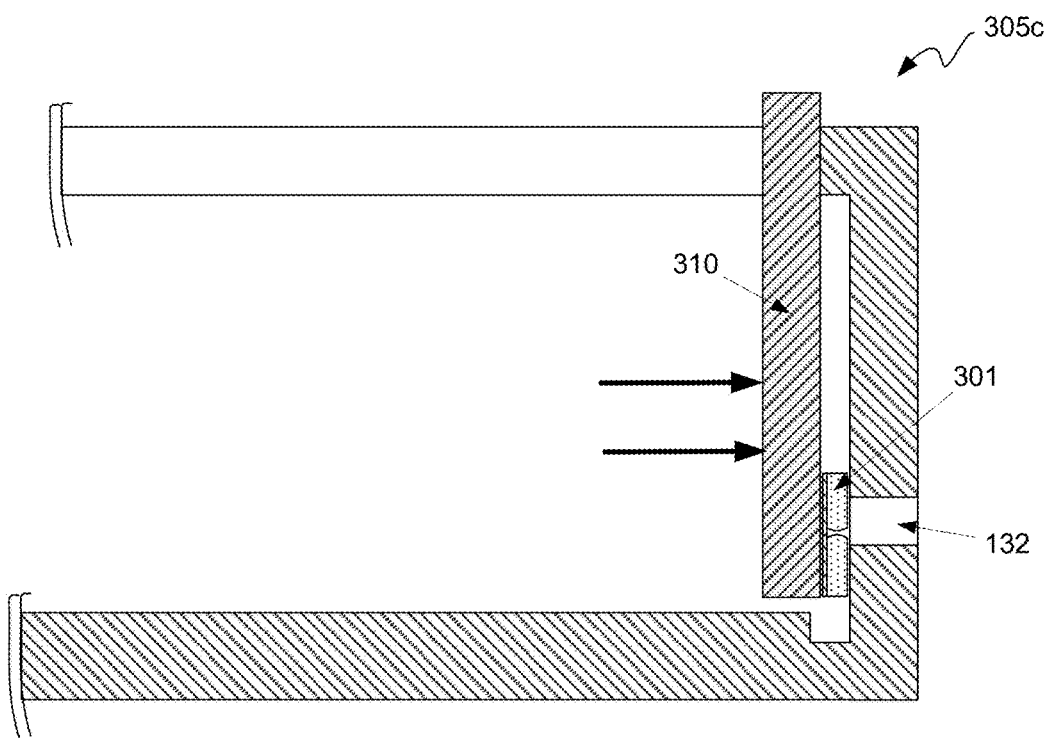
Figure 9D:
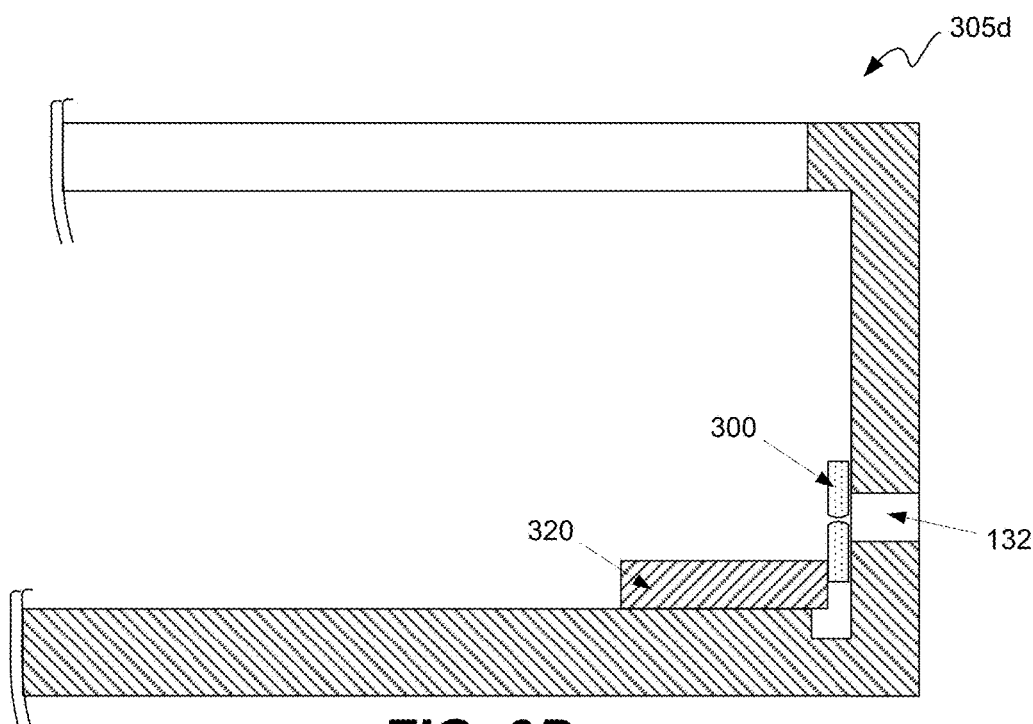

Continuing with FIG. 9C, the front lining of the felt application unit 301 can be removed and the fixture 310 can be moved laterally until the surface of the underlying felt contacts the housing wall or bezel. After installation at FIG. 9D, the fixture is removed, the back lining is removed, and the felt portion or portions 300 are adhered to the inner surface of the housing or bezel in a reliably aligned fashion, due to the self-adjusting alignment of the felt application unit 301 and fixture 310 prior to application at the surface. Alternatively, one or both of the linings 302 can be removed prior to inserting the fixture 310 and unit 301 into the housing, as may be suitable for a given application.

Finally, a pinch plate 320 can be installed against an inner surface of the housing and adjacent to the backside of the felt dust guard 300. Such an installation can be by way of an adhesive, fastener or other suitable means. Pinch plate 320 provides additional support behind the felt dust guard 300 so as to prevent delamination of the dust guard from the housing under repeated insertions and ejections of disc media, as will be readily appreciated.

Housing Machining Fixture

Turning next to FIG. 10A, the formation of an internal elongated notch or trough in the housing and an exemplary cutter therefor are shown in side cross-sectional view. As shown, elongated notch 400 having a depth D can be formed by way of manufacturing fixture or system 405, which can include a cutter 422 having a blade 420 on a shaft 410 that is inserted into the interior cavity of housing 102 by way of rear opening 107. In the event that opening 107 is unduly small, that notch 400 is relatively deep, and/or various other constraints that aggravate a ready notch formation in light of housing 102 being formed from a single piece of material, a special type of blade for such machining can be implemented.

Referring to FIG. 10B, an exemplary pinwheel cutter according to one embodiment of the present invention is shown in front elevation view. Pinwheel cutter 422 can have multiple blades 420 that can be affixed or otherwise coupled to an end of cutting shaft 410. As shown, pinwheel cutter can be designed such that the cutter has a relatively square footprint 424 having a side length X, while the actual cutting circumference 428 is defined in part by a cutting diameter 425 that is larger than this side length X. That is, where the height and width of the cutter is X, the cutting diameter of the cutter as it rotates is 1.41X (i.e., X times the square root of two). This is due to the particular shape of the pinwheel cutter and blades. In this same way, where a blade 420 has an edge with a length L, the cutting radius 426 as defined as the distance from the center point of the central hub to a cutting point 427 of a blade 420 is approximately 1.41 L and the cutting depth is well defined as being 0.41 L (1.41 L-1 L).

The effect of this shape and its rotation can be seen with respect to FIGS. 10C and 10D. While FIG. 10C illustrates the pinwheel blade cutter and its position while being inserted into the internal cavity of the housing, FIG. 10D illustrates the pinwheel cutter as inserted into the internal cavity of the housing and its position while cutting the internal elongated notch. Such cutting is particularly effective or maximized when the pinwheel cutter is rotated at 45 degrees with respect to its position upon insertion. In effect, the tips of the blades are able reach distances having a greater width than that which may be restricted by a small opening, in the event that opening 107 is designed to be narrow.

Drive Slot Silicone Barrier

Figure 11A:
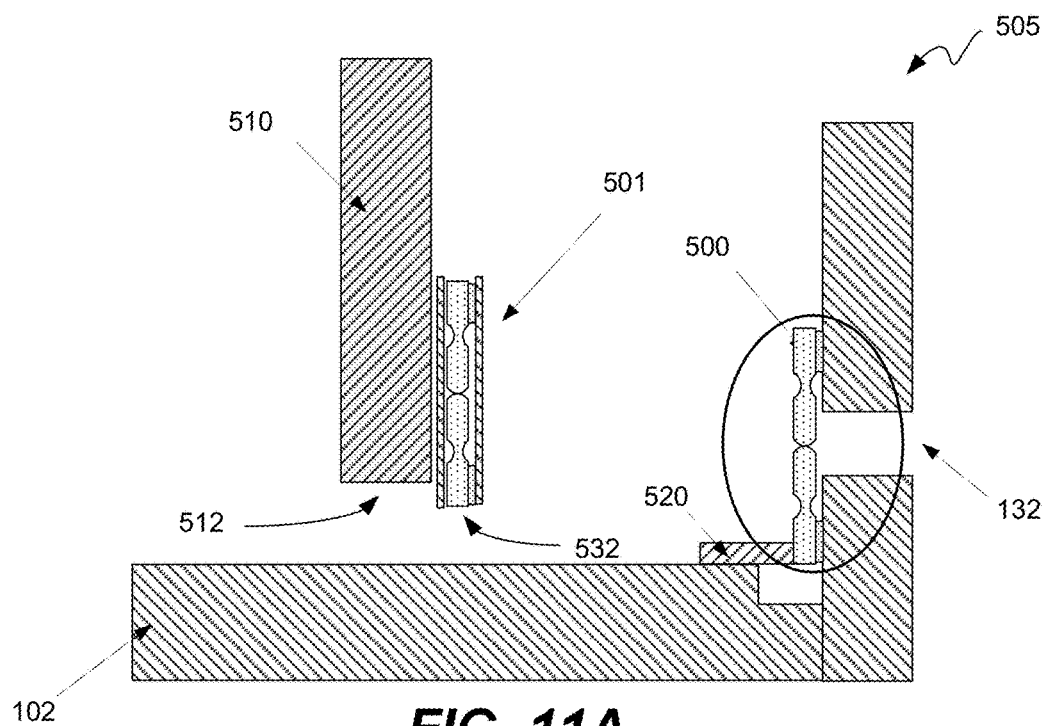
FIG. 11A illustrates in side cross-section view an installation of an alternative silicone ODD guard according to one embodiment of the present invention.
Figure 11B:
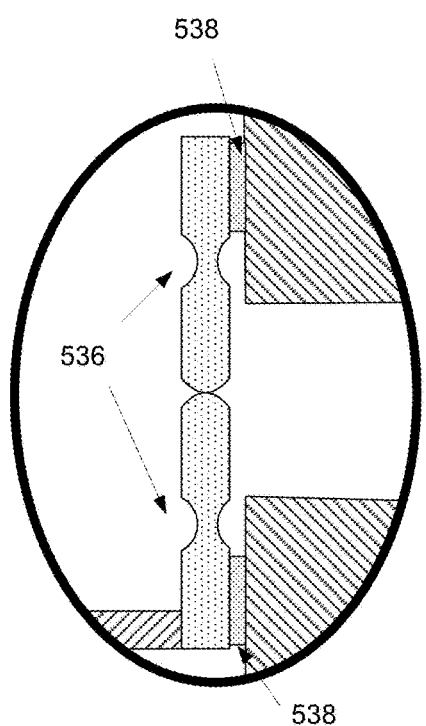
FIG. 11B illustrates in close-up side cross-section view the silicone ODD guard of FIG. 11A according to one embodiment of the present invention.

Moving now to FIGS. 11A and 11B, an alternative ODD dust guard to the earlier disclosed felt dust guard is provided. FIG. 11A illustrates in side cross-section view an installation of an alternative silicone ODD guard, while FIG. 11B illustrates in close-up side cross-section view the silicone ODD guard of FIG. 11A. Similar to the foregoing felt embodiment, silicone dust guard or inhibitor 500 can be installed proximate to an ODD slot, such as on the housing internal surface or on a bezel.

Silicone can be a more reliable material for forming such a dust guard. In one embodiment, a slit in the silicone dust guard can be formed prior to installation, as in the case of felt guards. In another embodiment, the silicone strip can be applied to the ODD slot without a slit formed, and the slit can then be cut into the strip after installation, such as by using a laser. This can result in a more accurate centered placement of the strip based on the actual housing dimensions and alignment from device to device. Use of silicone as a guard material is preferable for at least this particular reason. In addition, the use of silicone can be more aesthetically pleasing and can result in a greater inhabitance of dust intrusion depending upon the particular design and application used.

Upon installation by system 505, the application fixture 510 having a bottom surface 512, housing 102, ODD slot 132 and the like can all be substantially similar to the foregoing felt embodiment. However, the actual dust guard or inhibitor itself can be different, as can be its installation process and implementation in some regards. Silicon guard application unit 501 can have a lower surface 532, include a silicon guard as well as front and/or back backings, similar to the felt application unit. Although the slit is depicted as being precut, it will again be understood that forming the slit in the silicone guard can be left until after its installation for this type of material. The resulting silicone guard 500 is then adhered to an inner surface of the housing proximate to and effectively surrounding the ODD slot 132. A suitable pinch plate 520 can also be utilized to provide additional structural support to the silicone dust guard or inhibitor 500.

One issue with using silicone is that it is a much stiffer material than felt. Accordingly, the thickness of the silicone dust guard or shield should be substantially thinner than a typical felt guard, such that the material is able to give way when a disk medium is inserted into or ejected from the slot 132. Unfortunately, the effective material properties of silicone make it difficult to form this material to a thinness that is effective in giving way for the passage of disk media without leaving a significant gap between the top and bottom of the cut slit. Accordingly, a plurality of notches 536 can be formed in the silicone dust guard, which notches serve to turn the material into an effective hinge. This effect can be preserved by adhering the portions of the silicone dust guard that are beyond the formed notches, as illustrated by adhesive material 538 being located only above the notch 536 in the top portion of the affixed silicone dust guard 500 and only below the notch 536 in the bottom portion of the silicone dust guard. As will be readily appreciated, the result of the formed notches and self-hinged material is that the central portions of material near the cut slit are able to give more readily to allow passage of disk media. Notches 536 can be formed on both sides of the silicone dust guard, such that hinging action can be realized in both directions, corresponding to insertion and ejection of disks.

Methods of Use

Figure 12:
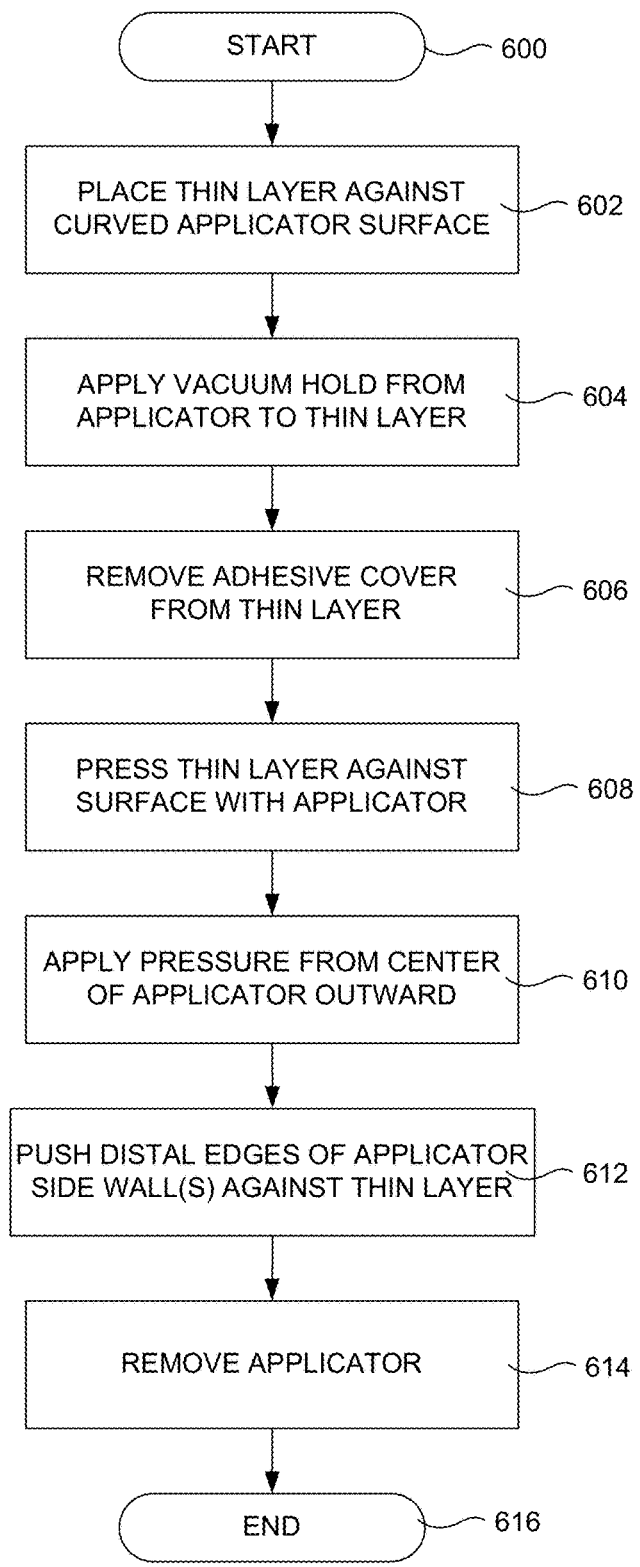
FIG. 12 provides a flowchart of an exemplary automated method for evenly applying a thin layer to a surface according to one embodiment of the present invention.
Figure 13:
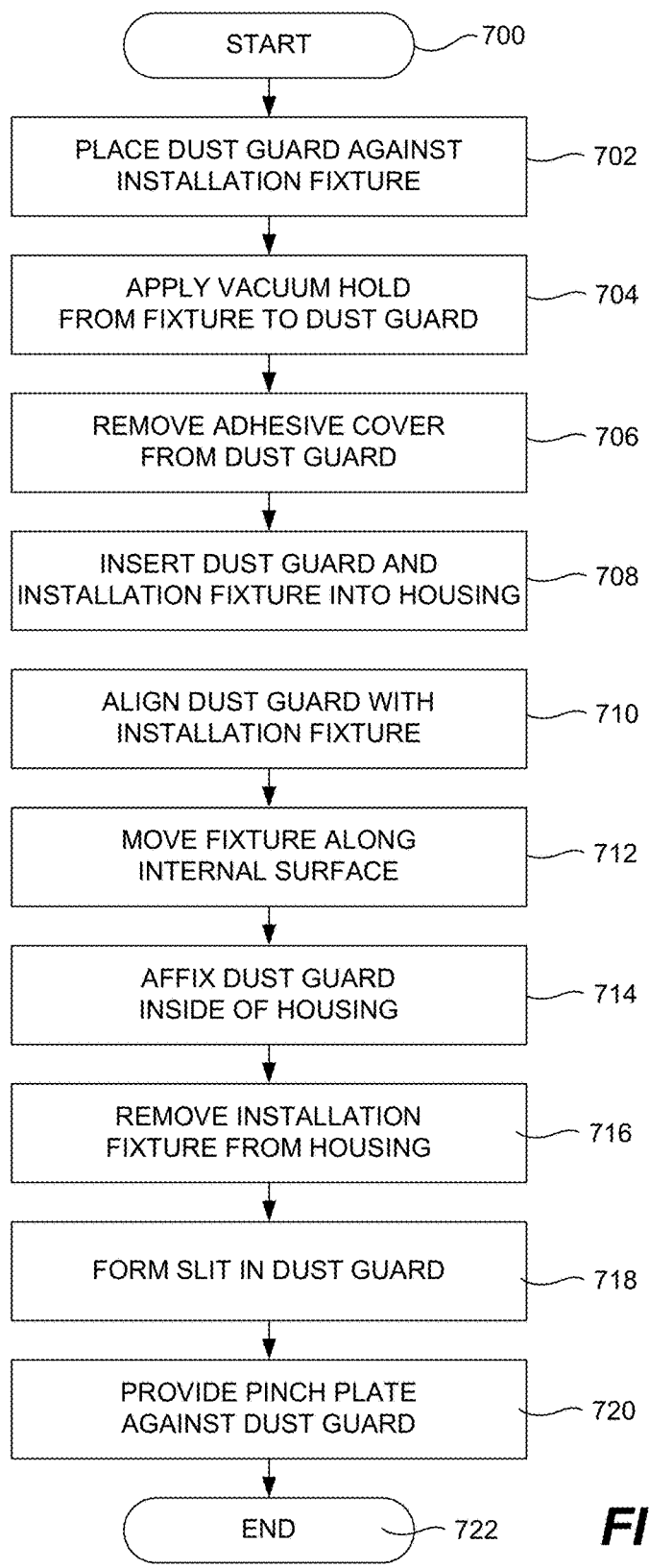
FIG. 13 provides a flowchart of an exemplary method of installing an optical drive dust guard according to one embodiment of the present invention.

Continuing next with FIGS. 12 and 13, flowcharts are provided with exemplary methods for evenly applying a thin layer to a surface and for installing an optical drive dust guard. It will be understood that the provided steps are shown only for purposes of illustration, and that many other steps may be included in the process, as may be desired. Furthermore, the order of steps may be changed where appropriate and not all steps need be performed in various instances. For example, steps such as steps 706 and 718 may be performed at several other locations in the method shown in FIG. 13, while steps such as steps 710, 712 and 720 in the method of FIG. 13 may not be needed in some cases.

Starting with FIG. 12, a method of applying a thin layer or tape to a surface begins with a start step 600 and then a process step 602 of placing a thin layer against a curved surface of a center applicator. Subsequently, process step 604 involves applying a vacuum hold from the applicator to the thin layer, while process step 606 involves removing an adhesive cover from the thin layer to expose an adhesive. This removal can be performed while the thin layer is held against the curved surface. Next at process step 608, the thin layer is pressed against the surface to which it is to be applied. At following process step 610, the pressure is applied at a central location and radially outward, such that the thin surface is applied in an even and consistent manner. At step 612, distal lower edges of the outer wall or walls of the applicator are pressed against an outer region or circumference of the thin layer. Such an application can involve the center portion of the applicator pressing the thin layer against the surface of a first component, with the outer walls of the applicator pressing the thin layer against the surface of a different component that surrounds the first component, as depicted above. At process step 614, the applicator is then removed, upon which the method then ends at end step 616.

Finishing with FIG. 13, a method of applying or installing an optical drive dust guard is presented. After a start step 700, a dust guard component or assembly is placed against a dust guard installation fixture at process step 702. At subsequent process step 704, a vacuum hold can then be created between the dust guard component and the fixture. An adhesive cover or lining can then be removed from the dust guard assembly at process step 706, although again this step can be performed at a later time if desired. The dust guard and fixture combination is then inserted into the housing at process step 708, whereupon the dust guard is aligned with the fixture at process step 710. Such an alignment can involve allowing the felt guard to slide along the fixture when edges of the felt guard and/or fixture contact an internal surface of the housing.

The felt guard and fixture combination can then be moved along an internal surface or otherwise within the housing at process step 712, so as to arrive at the desired installation point. At step 714, the dust guard can then be affixed with respect to an ODD slot in the housing. This can involve adhering the dust guard directly to an inner surface of the housing proximate the ODD slot in the housing, or to an intermediary component that is also arranged with respect to the ODD slot. The installation fixture can then be removed from the housing at process step 716. In the event that the dust guard is formed from silicone or another similarly suitable material, then a slit in the dust guard can subsequently be formed at process step 718. Again, the slit formation step can occur at an earlier point in the process, particularly if the dust guard is felt. A pinch plate can then be installed at process step 720 so as to provide added support to the back side of the dust guard, whereupon the method ends at end step 722.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A cutting tool for cutting a notch within a side wall of a housing, the cutting tool comprising:

a triangular cutting blade that extends outwardly from a central hub, the triangular cutting blade having a first edge that extends radially from the central hub, a second edge that is about as long as and is generally perpendicular to the first edge, and a third edge that is longer than the first and second edges and defines a right triangle with the first and second edges, wherein the second and third edges define a cutting portion, wherein when the second edge is brought in contact with the side wall, the cutting portion is positioned to cut the notch in the side wall, the notch having a well defined depth in accordance with a difference between a length of the third and second edges.

2. The cutting tool as recited in claim 1, wherein the cutting tool comprises four blades.

3. The cutting tool as recited in claim 2, wherein a triangular geometry of each of the four blades corresponds to an isosceles right triangle.

4. The cutting tool as recited in claim 1, wherein a length of a radius of the cutting tool is the distance from a center point of the central hub to a cutting point where the second edge connects to the third edge is approximately 1.41 times a length of the second edge.

5. The cutting tool as recited in claim 2, further comprising:

a motor coupled to a cutting shaft and configured to drive the four blades at a predetermined rotational speed.

6. The cutting tool as recited in claim 1, wherein the housing is formed from a single piece of material.

7. A method for cutting a notch into a side wall of an electronic device housing using a cutting tool having a plurality of triangularly shaped blades each having a first edge that extends radially from a central hub, a second edge that is about as long as and is generally perpendicular to the first edge, and a third edge that is longer than the first and second edges and defines a triangle with the first and second edges, wherein the second and third edges define a cutting portion, the method comprising:

bringing the second edge in contact with the side wall such that the cutting portion is positioned to cut the notch in the side wall; and rotating the cutting tool such that the cutting portion cuts the notch into the side wall, the notch having a well defined depth in accordance with a difference between a length of the third and second edges.

8. The method as recited in claim 7, further comprising:

subsequent to cutting the notch, reorienting the cutting tool such that the cutting tool is removable from the notch.

9. The method as recited in claim 8, further comprising:

removing the cutting tool through the notch.

10. The method as recited in claim 7, wherein a cutting radius of the cutting tool is about 1.41 times a length of the second edge.

11. A cutting assembly for machining a notch into an interior surface of a housing formed from a single piece of metal, the cutting assembly comprising:

a cutting tool, comprising:

substantially triangular blades extending from a central hub, each of the triangular blades having a first edge that extends radially from the central hub, a second edge that is generally perpendicular to the first edge, and a third edge that defines a right triangle with the first and second edges, wherein the second and third edges define a cutting portion, wherein when the second edge is brought in contact with the interior surface, the cutting portion is positioned to cut the notch in the interior surface, the notch having a well defined depth in accordance with a difference between a length of the third and second edges, and a cutting shaft having an end coupled to a central portion of the central hub of the triangular blades and configured to rotate the triangular blades about an axis arranged along a longitudinal axis of the cutting shaft; and a fixturing device configured to secure the housing in place while the cutting tool performs a cutting operation within the housing.

12. The cutting assembly as recited in claim 11, wherein the cutting tool has a footprint that is relatively square.

13. The cutting assembly as recited in claim 11, wherein the cutting tool has a footprint and, in one orientation a geometry of the footprint is substantially the same as an opening in the housing.

14. The cutting assembly as recited in claim 11, wherein the blades are evenly spaced about the central hub.

15. The cutting assembly as recited in claim 11, wherein a depth of the notch is about 0.4 times the length of the second edge.

\* \* \* \* \*